(12) United States Patent
Joshi et al.

(10) Patent No.: US 7,556,086 B2
(45) Date of Patent: Jul. 7, 2009

(54) ORIENTATION-INDEPENDENT THERMOSYPHON HEAT SPREADER

(75) Inventors: Yogendra Joshi, Burtonsville, MD (US); Sunil S. Murthy, Greenbelt, MD (US); Wataru Nakayama, Rockville, MD (US)

(73) Assignee: University of Maryland, College Park, College Park, MD (US)

( * ) Notice: Subject to any disclaimer, the term of this patent is extended or adjusted under 35 U.S.C. 154(b) by 0 days.

(21) Appl. No.: 09/828,564

(22) Filed: Apr. 6, 2001

(65) Prior Publication Data

US 2002/0179284 A1 Dec. 5, 2002

(51) Int. Cl.
*F28F 7/00* (2006.01)

(52) U.S. Cl. ............ 165/80.3; 165/104.21; 165/104.26; 165/104.17; 165/104.33; 361/700; 361/714; 361/715; 257/715

(58) Field of Classification Search ............ 165/104.21, 165/104.26, 104.37, 104.33, 104.17; 361/700, 361/714, 715; 257/715

See application file for complete search history.

(56) References Cited

U.S. PATENT DOCUMENTS

| | | | | |
|---|---|---|---|---|
| 3,739,235 | A | 6/1973 | Kessler, Jr. ............... | 317/234 R |
| 3,792,318 | A | 2/1974 | Fries et al. ............... | 317/234 R |
| 4,046,190 | A | 9/1977 | Marcus et al. ............... | 165/105 |
| 4,550,774 | A * | 11/1985 | Andres et al. ........... | 165/104.21 |
| 5,051,814 | A * | 9/1991 | Paal ........................... | 357/81 |
| 5,076,350 | A * | 12/1991 | Grantz et al. ........... | 165/104.21 |
| 5,076,351 | A * | 12/1991 | Munekawa et al. ..... | 165/104.21 |
| 5,323,292 | A * | 6/1994 | Brzezinski ............... | 361/689 |
| 5,704,416 | A * | 1/1998 | Larson et al. ........... | 165/104.33 |
| 5,761,037 | A * | 6/1998 | Anderson et al. ........... | 361/700 |
| 5,844,310 | A | 12/1998 | Okikawa et al. ............ | 257/712 |
| 5,953,930 | A | 9/1999 | Chu et al. .................. | 62/259.2 |
| 6,005,772 | A * | 12/1999 | Terao et al. ................. | 361/699 |
| 6,085,831 | A * | 7/2000 | DiGiacomo et al. ..... | 165/104.33 |
| 6,167,948 | B1 * | 1/2001 | Thomas ................. | 165/104.26 |
| 6,269,865 | B1 * | 8/2001 | Huang ................... | 165/104.26 |

(Continued)

OTHER PUBLICATIONS

Communication Pursuant to Article 96(2) EPC, European Patent Office, dated Feb. 24, 2004.

(Continued)

*Primary Examiner*—Henry Bennett
*Assistant Examiner*—Nihir Patel
(74) *Attorney, Agent, or Firm*—Matthew W. Witsil; Moore & Van Allen PLLC

(57) ABSTRACT

Device for enhancing cooling of electronic circuit components that is substantially or fully independent of orientation. A thin profile thermosyphon heat spreader mounted to an electronics package comprises a central evaporator in hydraulic communication with a peripheral condenser, both at least partially filled with liquid coolant. A very high effective thermal conductivity results. Performance is optimized by keeping the evaporator substantially full at all orientations while leaving a void for accumulation of vapor in the condenser. A cover plate and a parallel base plate of generally similar dimension form the evaporator and condenser. Optionally, an opening in the base plate is sealed against the electronics package and places the heat-dissipating component in direct contact with the liquid coolant. Alternatively, the base plate may be formed with the electronics package from a single piece of material. A boiling enhancement structure is provided in the evaporator to encourage vapor bubble nucleation.

8 Claims, 11 Drawing Sheets

U.S. PATENT DOCUMENTS

| | | | |
|---|---|---|---|
| 6,474,074 B2 * | 11/2002 | Ghoshal | 62/3.7 |
| 6,808,015 B2 * | 10/2004 | Osakabe | 165/104.25 |
| 6,957,692 B1 * | 10/2005 | Win-Haw et al. | 165/104.33 |
| 2001/0023758 A1 * | 9/2001 | Osakabe | 165/104.33 |

OTHER PUBLICATIONS

European Patent Office, European Application No. 02 733 928.2, Communication Pursuant to Article 96(2) EPC, Aug. 1, 2006, Applicant: University of Maryland, College Park.

* cited by examiner

ORIENTATION-INDEPENDENT THERMOSYPHON HEAT SPREADER

BACKGROUND

1. Field of the Invention

This invention generally relates to the field of heat dissipation. More specifically, the invention relates to a thermosyphon that enhances cooling of electronic systems.

2. Description of the Problem

Cooling of electronic circuit components in thin space enclosures is often performed by metal plates that spread heat, referred to as heat spreaders. Examples of devices where heat spreaders are used include portable computers, high-speed memory modules, inkjet printers, and some handheld devices. A heat spreader's internal thermal resistance, which is a measure of the heat removal performance of a device, increases as the spreader thickness decreases. Size reductions of electronic systems make thinner spreaders necessary. Increasing the thermal conductivity of the spreader can offset the resulting increased internal resistance. One way to achieve very high effective thermal conductivity is to use a fluid-filled cooling device that takes advantage of the heat of vaporization of the fluid by transporting heat from an evaporator to a condenser through the liquid-vapor phase change. Two known types of devices in particular employ this phase-change mechanism for heat transfer from electronic circuit components: thermosyphons and heat pipes.

Thermosyphons are fluid-filled closed loop devices, incorporating an interconnected evaporator and condenser. The working fluid undergoes a liquid to vapor phase change in the evaporator, thereby absorbing the latent heat of vaporization. The vapor then travels to the condenser, where the heat is lost to the environment and the cooled working fluid condenses to liquid The evaporator is typically oriented vertically with respect to the electronic circuit component to be cooled. The performance of an entirely passive system, where there are no moving parts, requires the condenser to be located vertically above the evaporator. The use of known thermosyphons is therefore limited to enclosures that can accommodate and remain fixed in this required orientation.

Heat pipes are hollow sealed devices, containing a wick structure saturated with a working fluid. Despite their name, which came from the geometry of the early forms of the devices, heat pipes may be any shape. In their early shape that resembles a pipe, heat is transferred from electronic circuit components, typically the processor chip, to the working fluid in the evaporator portion at one end of the heat pipe. The working fluid undergoes a liquid to vapor phase change in the evaporator portion, thereby absorbing the latent heat of vaporization. This heat is carried by the working fluid to the other end of the pipe, which is the condenser portion, and is rejected to the environment. The cooled working fluid vapor condenses, and urged by the surface tension forces that are generated by the wick structure, returns to the evaporator portion.

Current known heat pipe structures include flat-plate heat pipes, where heat may be added at any location. The working fluid evaporates, moves to lower pressure and cooler regions of the cavity, and is cooled on the walls of the heat pipe where it condenses. In recently developed micro heat pipes, microfabricated grooves replace the wick structure and provide the capillary action for the return of the condensed vapor to the evaporator portion of the device.

While heat pipes do not have the geometric orientation constraints of thermosyphons and are an improvement over known heat spreaders, their performance is limited. A significant drawback of the heat pipe comes from its very mechanism, that is, capillary driving of the condensate that makes the heat transfer performance orientation-independent. The capillary action in the heat pipe is based on the thinness of liquid film in the wicking structure, and the difference in liquid/vapor menisci in the condenser and the evaporator. If the liquid film is thick, gravity comes to influence the liquid flow, and the heat pipe performance becomes orientation-dependent. Liquid evaporates as the condensate flows toward the middle of the evaporator section in a flat heat pipe, or toward the end of the evaporator section in a cylindrical heat pipe. The circulation rate of the working fluid in the heat pipe is constrained where the liquid film thickness reduces to zero due to evaporation. A part of the evaporator surface dries, and the surface temperature then increases beyond a level acceptable for the application. This so-called "capillary limit" restricts the application of heat pipes to cases of moderate chip heat dissipation and relatively small heat spreader areas. Larger heat spreader areas inherently have longer wicking structure length, and hence there is more potential for poor performance as a result of the capillary limit. Better thermal performance is desirable to meet the cooling requirements of increasingly faster electronic circuit components.

There is a need for a device that has superior cooling performance while eliminating the orientation constraints of known thermosyphons. Ideally, the device will be generally orientation-independent, and will be compact in size as necessary to meet thin space enclosure requirements.

SUMMARY

The thermosyphon of the present invention enhances cooling of electronic systems and has very high effective thermal conductivity while being substantially or fully unconstrained by physical orientation. It has a relatively thin profile as necessary to fit in tight enclosures that are increasingly common in electronic systems.

The present invention meets the above objects by providing a thermosyphon heat spreader for cooling an adjacent heat-dissipating component, such as a semiconductor chip or other electronic circuit component, referred to as an electronics package. The thermosyphon comprises a central evaporator in contact with the electronics package, a peripheral condenser, or pool belt, that extends around and hydraulically communicates with the evaporator, a liquid coolant that at least partially fills the evaporator and pool belt; and means for cooling the condenser. The central evaporator includes, in one embodiment, two parallel plates of generally similar dimension, with opposing faces of the plates forming the interior surface of the evaporator.

The thermosyphon may optionally have an opening in the base plate that is sealed against the electronics package and places the heat-dissipating component in direct contact with the liquid coolant. Alternatively, the base plate may be formed with the electronics package from a single piece of material.

In further accordance with the present invention, a boiling enhancement structure is provided in the evaporator, mounted to the interior surface of the base plate. The boiling enhancement structure may be a plate with grooves that form voids, or an open-celled foam. The means for cooling the condenser may be provided by any known method or device. Such means include, but are not limited to, cooling fins and liquid-cooled jackets that surround the condenser. To optimize performance, gasses are purged from the evaporator and pool belt.

In yet further accordance with the present invention, the thermosyphon, in another embodiment, has a substantially full or full evaporator for orientations ranging from horizontal to vertical, or from 0 to 90 degrees. In a still further embodiment, the evaporator is substantially full or full for all orientations.

In a yet further embodiment, a specific geometry thermosyphon according to the present invention is provided. This includes parallel base and cover plates forming the evaporator, and generally U-shaped walls extending from the entire periphery of each plate. The U-shaped walls form the pool belt. One end of the "U" on each wall is connected to the respective base or cover plate, and the other end of the "U" mates with the corresponding end of the "U" on the other plate's wall, with the opening in the "U" facing the opposing plate. The respective geometries of the evaporator and condenser may vary, and dimensions in the orientation-independent embodiment are determined by meeting the design requirement of keeping the evaporator substantially full or full at all orientations while leaving a void in the pool belt where vapor may collect. The planar limits of the evaporator and pool belt may be any shape, for example, square, rectangular, or circular. A thermosyphon is also provided that can be vertically oriented and rotated in a vertical plane such that its edges form an angle with the horizontal plane.

An enhanced-cooling electronic component is also provided in accordance with the present invention. This component includes a heat-dissipating element, such as a semiconductor chip, a casing in which the element is disposed, and a thermosyphon in accordance with the present invention. A method for cooling a heat-dissipating element is provided that includes using a thermosyphon according to the present invention and placing the thermosyphon in contact with the heat-dissipating element.

The present invention features use of the latent heat of vaporization of the liquid coolant to provide very high thermal conductivity. The central evaporator and peripheral condenser are symmetric about a central plane, leading to independence of orientation of the thermosyphon heat spreader. Liquid coolant volume is optimized to keep the evaporator substantially full or full at all orientations and yet provide a void in the condenser that allows accumulation of vapor as the coolant evaporates. A boiling enhancement structure encourages nucleation of vapor bubbles by providing re-entrant cavities.

The foregoing and other features and advantages of the present invention will become more apparent in light of the following detailed description of some embodiments thereof, as illustrated in the accompanying figures. As will be realized, the invention is capable of modifications in various respects, all without departing from the invention. Accordingly, the drawings and the description are to be regarded as illustrative in nature, and not as restrictive.

DETAILED DESCRIPTION

Figure 1:
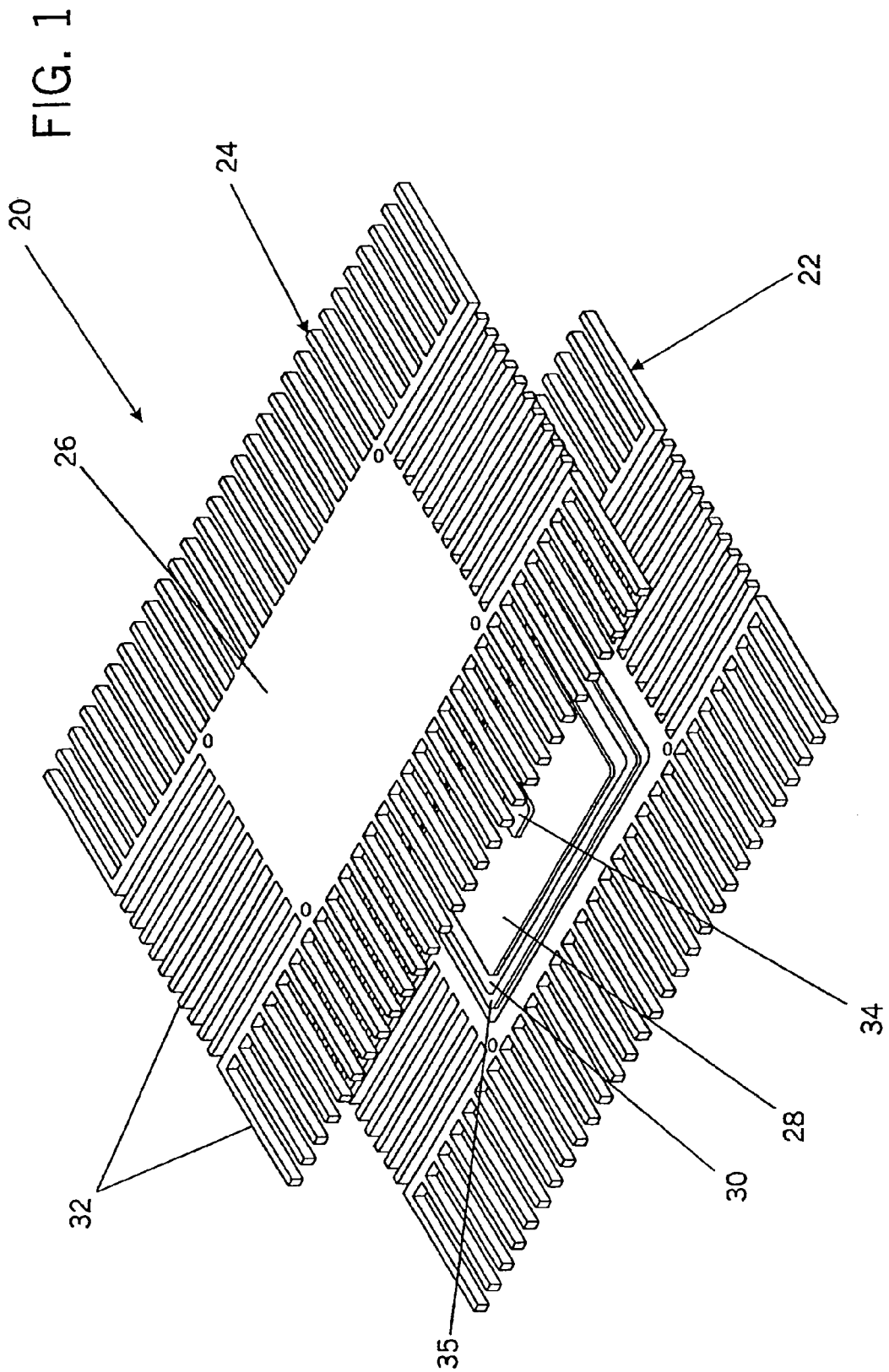
FIG. 1 is an exploded perspective view of a thermosyphon according to the present invention.

FIG. 1 illustrates a flat, thin, orientation-independent thermosyphon heat spreader 20 according to the present invention. The thermosyphon 20 comprises a base plate 22 and a cover plate 24. The base plate 22 and cover plate 24 mate, causing recessed areas in the plates to define a phase-change heat transfer system 26, including a central evaporator region 28 in hydraulic communication with peripheral condenser region 30. The condenser region 30 is referred to as a pool belt. Means for cooling the pool belt 30 are provided in the present embodiment by cooling fins 32. The evaporator 28 preferably includes a boiling enhancement structure 34. Liquid coolant, not shown, at least partially fills the evaporator 28 and pool belt 30, and an elastomeric gasket, placed in the groove 35 around the periphery of the pool belt, imperviously seals the connection between the base and cover plates 22, 24.

The material selection for the base and cover plates 22, 24 depends on application requirements for ease of fabrication and service reliability. Aluminum may be desirable if used with inert liquid coolants and at relatively low temperatures because of its ease of machinability and lower density compared to other metals. However, corrosion concerns make aluminum an inappropriate choice if water is the liquid coolant and the temperature is not low. Materials with better thermal properties, like copper, can be used to make the plates 22, 24, and other metals may be used as selected by someone of ordinary skill in the art. In addition, metal matrix composites such as aluminum silicon carbide (AlSiC) may be used if the residual stresses between the plate material and a silicon-based substrate that is the adjacent electronic circuit component, resulting from the mismatch in the coefficient of thermal expansion, are a concern.

The base plate 22 and cover plate 24 are substantially planar in geometry. Each plate 22, 24 has a first major surface and a second major surface. The major surfaces coincide with the substantially planar geometry of the plates 22, 24, and are the largest faces of the plates 22, 24. Although the terms "base" and "cover" are sometimes used with reference to orientation such as "bottom" and "top," the use of the terms "base" and "cover" herein should not be considered to restrict orientation. Rather, the "base" plate 22 is merely the plate that is proximate to a component to be cooled, and the "cover" plate 24 opposes and is spaced from the base plate 22. In addition, the evaporator 28 may be formed from a first and a second plate, that may or may not be portions of a respective unitary base plate 22 or cover plate 24.

Figure 2:
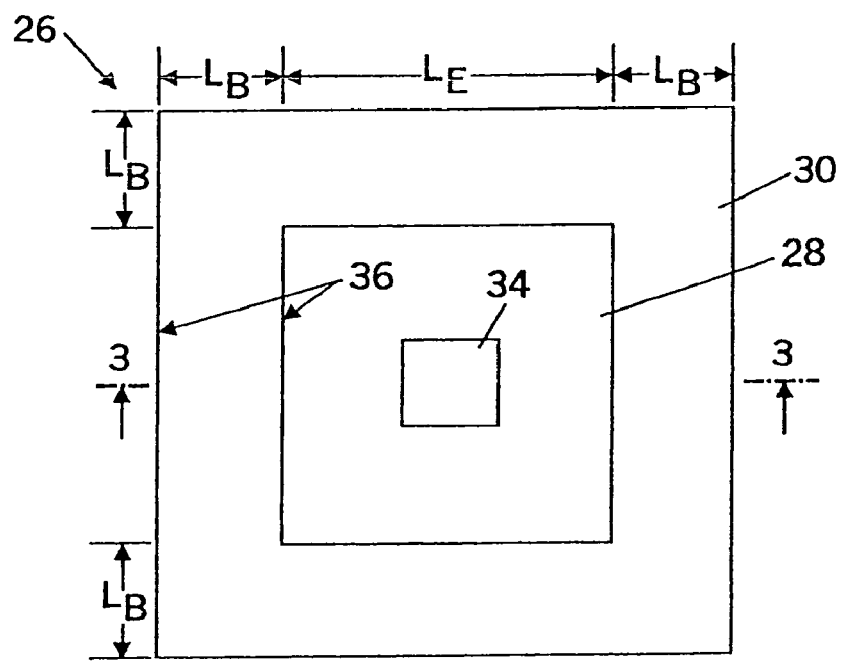
FIG. 2 is schematic top plan view of condenser and evaporator portions of the thermosyphon of FIG. 1.
Figure 3:
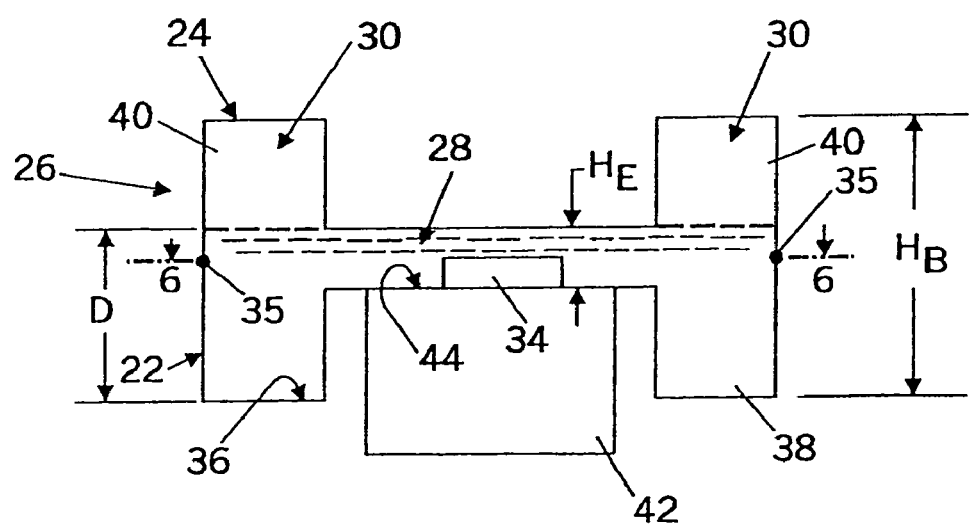
FIG. 3 is a schematic section view of condenser and evaporator portions of the thermosyphon of FIG. 2 taken along line 3-3, with the thermosyphon oriented horizontally and mounted to an electronic circuit component located beneath it.

The limits of the evaporator 28, pool belt 30, and boiling enhancement structure 34 in the phase-change heat transfer system 26 of the thermosyphon 20 according to the present invention are schematically illustrated in FIGS. 2 and 3. For simplicity of description, the shape of each of these features in top (plan) view (FIG. 2), i.e. the planar shape, is square and in cross-section (FIG. 3) is rectangular, and the dimensions are not to scale, but the features may be any shape as desired to suit a particular application or manufacturing advantage. Again for simplicity, only the interior surfaces, i.e. walls 36, of the heat transfer system 26 of the thermosyphon 20 are shown. In the horizontal position shown in FIG. 3, the liquid coolant 38 preferably fills the evaporator 28 and partially fills the pool belt, leaving a void 40.

For indirect liquid cooling the evaporator 28 is mounted directly to an electronic circuit component, or electronics package 42. The contact between the base plate 22 and the electronics package 42 is made on a free major surface 44 of the electronics package. This free major surface 44 is a surface of the electronics package 42 that is, prior to mounting of the thermosyphon 20, unattached, generally planar, and frequently a portion of the electronics package with the largest surface area. In this embodiment, the base plate 22 and cover plate 24 can be identical. Alternatively, to provide direct liquid cooling of the electronics package 42, the electronics package can be integrated into the base plate 22, immersing the electronics package in the coolant 38. Such integration may be done by sealing a base plate 22 that has an opening in it to the electronics package 42, by fabricating the base plate and electronics package from one piece of material, or by other means known to someone of ordinary skill in the art.

A variety of working fluid liquid coolants 38 can be used based on several factors including, but not limited to, boiling or evaporation temperature, chemical compatibility with the components of the evaporator unit in case of indirect liquid cooling and with the electronic package in case of immersion cooling, chemical stability, toxicity and cost. Coolants that are preferred for use with the invention include ethyl alcohol and fluorochemicals, such as FLUORINERT™ (FLUORINERT is a trademark of and is manufactured by the Minnesota Mining and Manufacturing Company, St. Paul, Minn.).

The system 26 is preferably purged of residual gasses to improve heat transfer performance. The void 40 is evacuated in advance of using the thermosyphon 20 in order to reduce pressure and eliminate resistance to the liquid-to-vapor phase change. The presence of residual gasses not only deteriorates the heat transfer characteristics of the system, but in the case of FLUORINERT™ liquids, residual gasses also change the properties of the coolant. Also, sub-atmospheric pressures ensure removal of heat at high heat fluxes while maintaining low surface temperatures on the walls of the pool belt 30.

In the Figures herein, unique features receive unique numbers, while features that are the same in more than one drawing receive the same numbers throughout. Where a feature is modified between figures, a letter is added or changed after the feature number to distinguish that feature from a similar feature in a previous figure.

Figure 4:
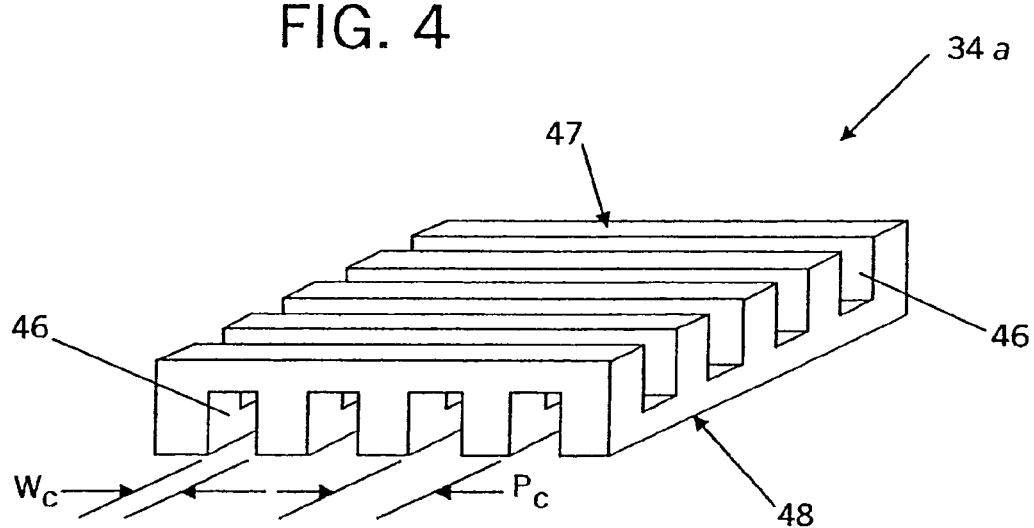
FIG. 4 is a perspective view of a boiling enhancement structure of the thermosyphon of FIG. 1.

The boiling enhancement structure 34 is a porous component that provides re-entrant cavities 46. One such structure 34a is illustrated in FIG. 4. Re-entrant cavities 46 have the characteristic ability to entrap vapors, thereby becoming active nucleation sites for the formation of vapor. For example, a single layer structure 34a is made from a square plate with parallel rectangular channels that define the re-entrant cavities 46, preferably cut to more than half the thickness of the layer from major surfaces 47, 48 on each side of the plate. These channels intersect to form square cavities 46, which in turn act as sites for vapor bubble nucleation. The heat transfer performance of the thermosyphon system depends on optimizing the channel width $W_C$ and pitch $P_C$ of the porous microstructures employed. Maximizing heat dissipation, in turn, depends on selection of the working fluid 38. In an indirect liquid cooling configuration, the boiling enhancement structure is attached to the center of the evaporator section of the thermosyphon plate. Good thermal contact between the porous enhancement structure 34a and the evaporator 28 may be achieved through the use of a thin paste of solder or high thermal conductive epoxy. In a direct immersion cooling configuration, the enhancement structure 34 is directly attached on the passive side of the electronics package 42 die surface, eliminating the contact resistance inherent when there is heat transfer across adjacent mating surfaces.

Boiling enhancement structures 34a with channels may be made from a variety of materials such as copper, diamond, silicon, or other as selected by someone of ordinary skill in the art, and may be a variety of shapes. The micro-channels may be made by techniques such as wet-chemical etching, laser milling, or wafer dicing, or other known processes.

Figure 5:
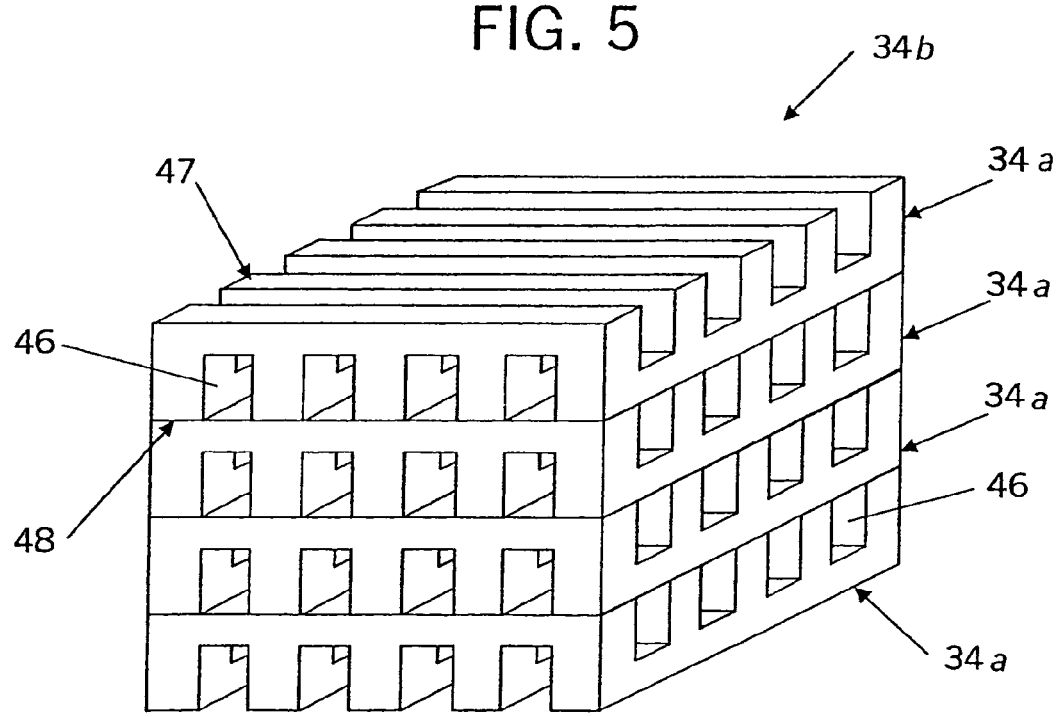
FIG. 5 is a perspective view of another embodiment of a boiling enhancement structure of the thermosyphon of FIG. 1.

The width $W_C$ and pitch $P_C$ are determined by thermal considerations as well as convenience in assembling multi-layer enhancement devices 34b, as shown in FIG. 5. Thermal considerations require an analysis of benefits and costs related to performance. As the pitch $P_C$ increases, heat conduction paths in solid parts become wider and thereby conduct more heat from the device base to the end, while at the same time the number of channels on a fixed device footprint area decreases, reducing the area available for heat transfer. As illustrated in FIG. 5, the boiling enhancement structure can be made of stacked single layers 34a to make the multiple layer structure 34b. Assembly requires securing sufficient interfacial areas to stack and bond component plates. In operation, the structural integrity of the device 34b depends on the bonding strength, which also relies on the interfacial area. Experiments have been carried out on the enhancement structures 34a, 34b for channel widths $W_C$ ranging from 40-320 µm and pitches $P_C$ from 0.5-3.0 mm.

As an alternative to this type of micro-channel structure 34a, 34b, commercially available open-celled porous foam may also be used to make the structure 34. Examples of suitable foams include DUOCEL® aluminum and silicon carbide foams from ERG Materials and Aerospace Corporation of Oakland, Calif. (DUOCEL is a registered trademark of Energy Research and Generation, Inc. of Oakland, Calif.) and INCOFOAM® nickel foam from Inco Limited of Toronto, Canada (INCOFOAM is a registered trademark of Inco Limited).

Optimizing design of the system 26 depends on one factor in particular: For any given orientation, the evaporator 28 should be substantially full of liquid coolant 38. As shown in FIG. 3, the pool belt 30 has a greater height, $H_B$, than that of the evaporator 28, $H_E$. In a horizontal orientation, again as shown in FIG. 3, the depth D of the coolant 38 is preferably at least approximately $(H_B+H_E)/2$.

Each different shape of phase-change heat transfer system 26 will have an orientation on which the design needs to be based. For a square planar shape such as the geometry shown in FIGS. 2 and 3, the requirement of keeping the evaporator substantially full determines the dimensions of the evaporator 28, $H_E$ and $L_E$, and the pool belt 30, $H_B$ and $L_B$.

Figure 6:
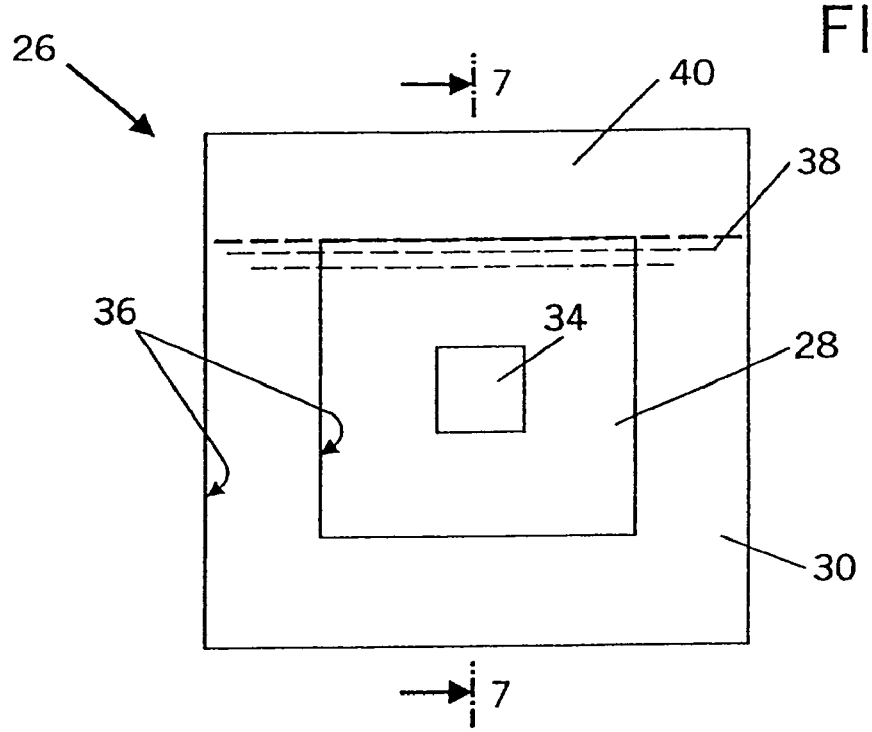
FIG. 6 is a schematic section view of condenser and evaporator portions of the thermosyphon of FIG. 3 taken along line 6-6, with the thermosyphon oriented vertically.
Figure 7:
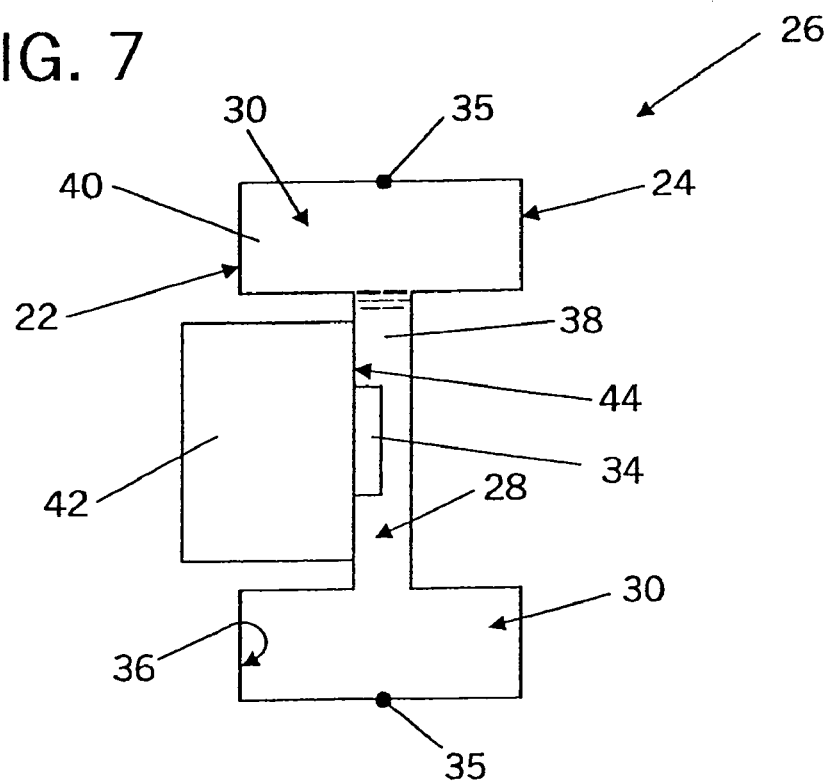
FIG. 7 is a schematic section view of condenser and evaporator portions of the thermosyphon of FIG. 6 taken along line 7-7, with the thermosyphon oriented vertically and mounted to an electronic circuit component.

To keep the evaporator 28 completely full in the vertical orientation shown in FIGS. 6 and 7, and as a result, at least substantially full in all orientations, with the coolant depth approximately equal to $(H_B+H_E)/2$ when in a horizontal orientation, the dimensions of the system 26 must approximately satisfy the following equation:

$$H_B/H_E = 2(1+L_B/L_E).$$

Figure 8:
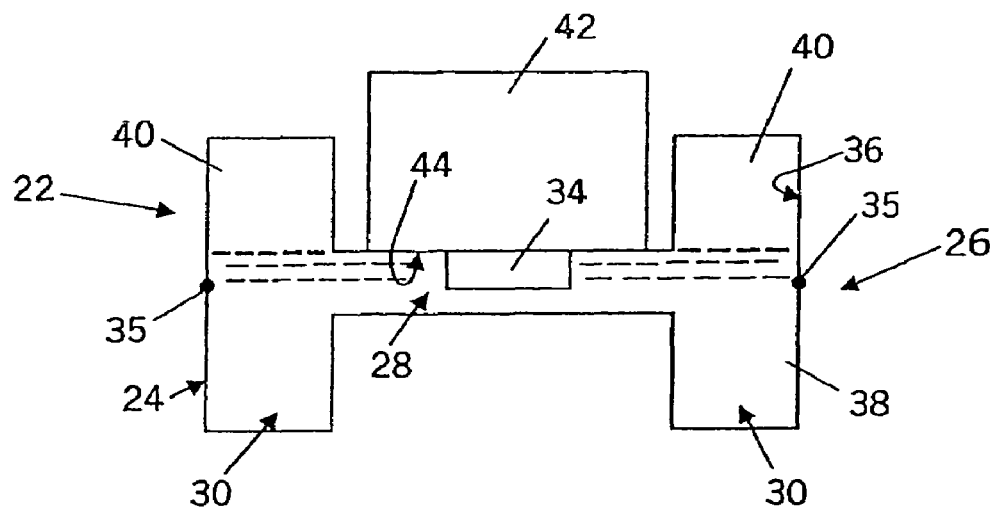
FIG. 8 is a schematic section view of condenser and evaporator portions of the thermosyphon of FIG. 2 taken along 3-3 with the thermosyphon oriented horizontally and mounted to an electronic circuit component located above it.

Conformance to this equation also provides a completely full evaporator in either horizontal orientation, as shown in FIGS. 3 and 8, regardless of which of the base plate 22 or cover plate 24 is on top. Where the term "approximately satisfy" or the like is used herein, it means that the referenced equation need not be exactly true, but requires only that the values calculated on each side of the equation provide a thermosyphon that performs in the spirit of the present invention. Where the term "substantially full" or the like is used herein to describe the evaporator, it means that the evaporator volume, i.e. the volume defined by the plates forming the evaporator, contains a quantity of liquid coolant adequate to provide a thermosyphon that performs in the spirit of the present invention, and includes a range of coolant quantities equal to or less than a completely full evaporator.

FIG. 8 schematically illustrates a system 26 that conforms to this equation, and has a completely full evaporator 28 when oriented as shown, rotated 180 degrees from the orientation shown in FIG. 3. The pool belt 30 must be vertically symmetric about the evaporator 28 to achieve this result when the coolant level approximately conforms to the $(H_B+H_E)/2$ criterion in the horizontal orientation. An asymmetric pool belt 30 can result in a system 26 that has a substantially full evaporator 28 only in certain orientations. For example, the evaporator 28 may be substantially full from a horizontal orientation through rotation to a vertical orientation, but past that vertical orientation the evaporator may not be substantially full. Such a thermosyphon may be designed in accordance with the present invention by one of ordinary skill in the art.

Figure 9:
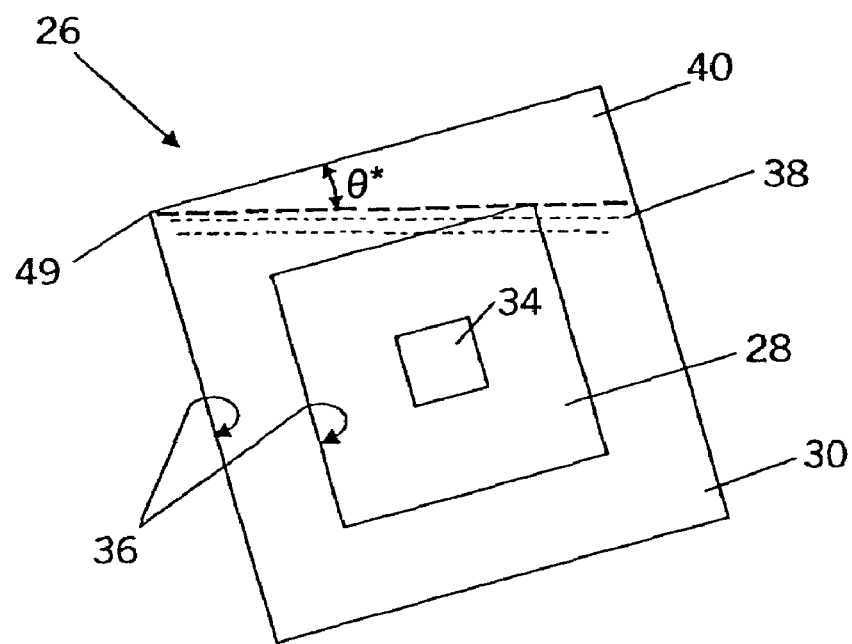
FIGS. 9 through 12 are schematic section views of condenser and evaporator portions of the thermosyphon of FIG. 3 taken along line 6-6, with the thermosyphon oriented vertically and with the edges of the condenser and evaporator portions at various angles away from horizontal.

FIG. 9 shows a square-shaped system 26 that is oriented with the limits of the evaporator 28 and condenser 30 at an angle $\theta^*$ to horizontal. The angle $\theta^*$ is fixed by the dimensions of the system 26 and is given by the following equation:

$$\theta^* = \tan^{-1}\left(\frac{L_B}{L_B+L_E}\right)$$

When the system 26 is in a vertical orientation and is tipped to an angle of $\theta^*$, the surface of the coolant is at the uppermost point of the evaporator 28 and at the second highest corner 49 of the condenser 30. The dimensions of the square system 26 may be modified to provide a filled evaporator for any given angle $\theta$, depending on whether $\theta$ is less than or greater than $\theta^*$, as shown in FIGS. 10 and 11.

Figure 10:
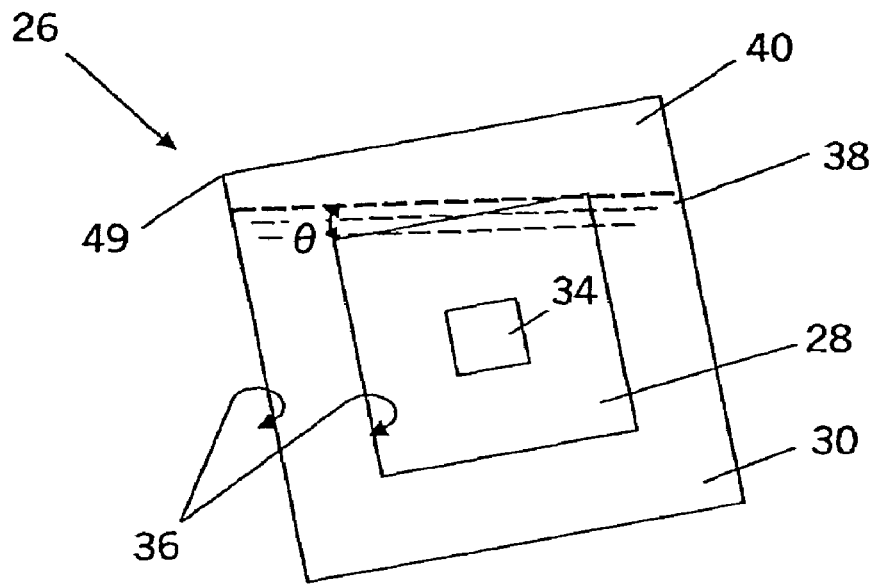
Figure 11:
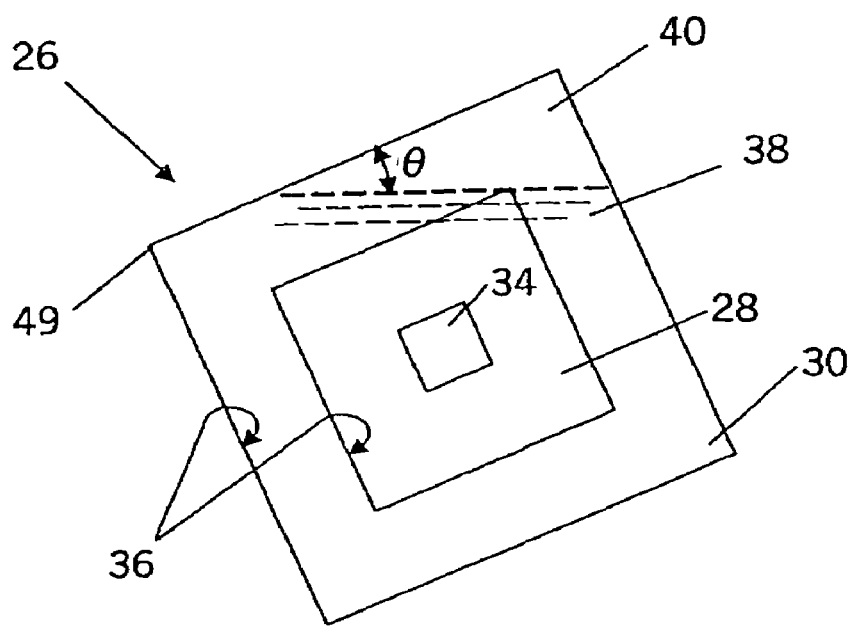

In FIG. 10, the system 26 is at an angle $\theta$ that is greater than 0 degrees and less than or equal to $\theta^*$. In FIG. 11, the system 26 is at an angle $\theta$ that is greater than or equal to $\theta^*$ and less than or equal to 45 degrees. Approximately satisfying the condition of a coolant 38 depth of $(H_B+H_E)/2$ when in the horizontal orientation and the following equations when in rotated vertical orientations (as shown in FIGS. 10 and 11) provides a full evaporator for a given angle $\theta$.

For $0 \leq \theta \leq \theta^*$ (FIG. 10):

$$\frac{H_B}{H_E} = \frac{2\left(1+\frac{L_B}{L_E}\right)\frac{L_B}{L_E}}{\frac{L_B}{L_E}+\left(\frac{1}{2}+\frac{L_B}{L_E}\right)\tan\theta}$$

For $\theta^* \leq \theta \leq 45°$ (FIG. 11)

$$\frac{H_B}{H_E} = \frac{1+\frac{L_B}{L_E}}{1+\frac{1}{2}\left\{1-\frac{1}{2}(\tan\theta+\cot\theta)\right\}\frac{L_B}{L_E}}$$

Figure 12:
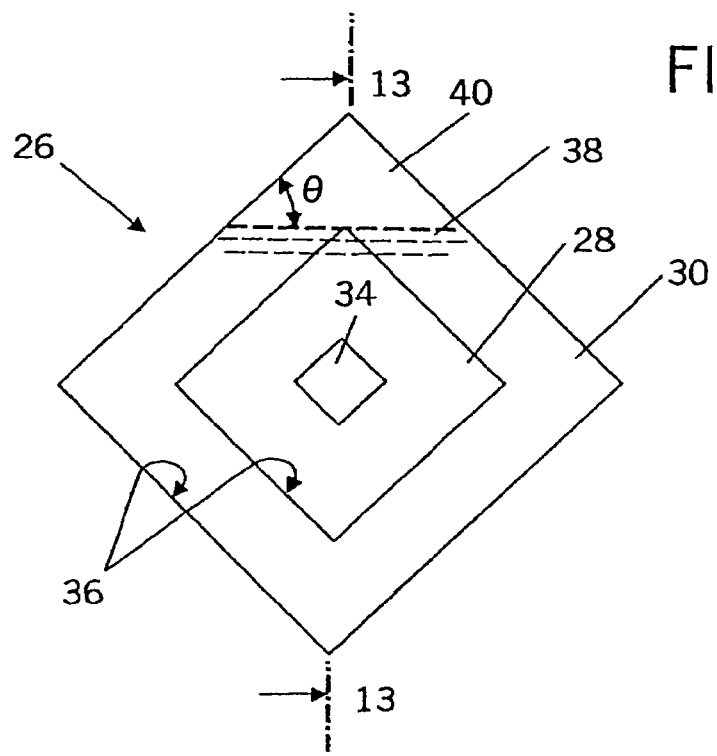
Figure 13:
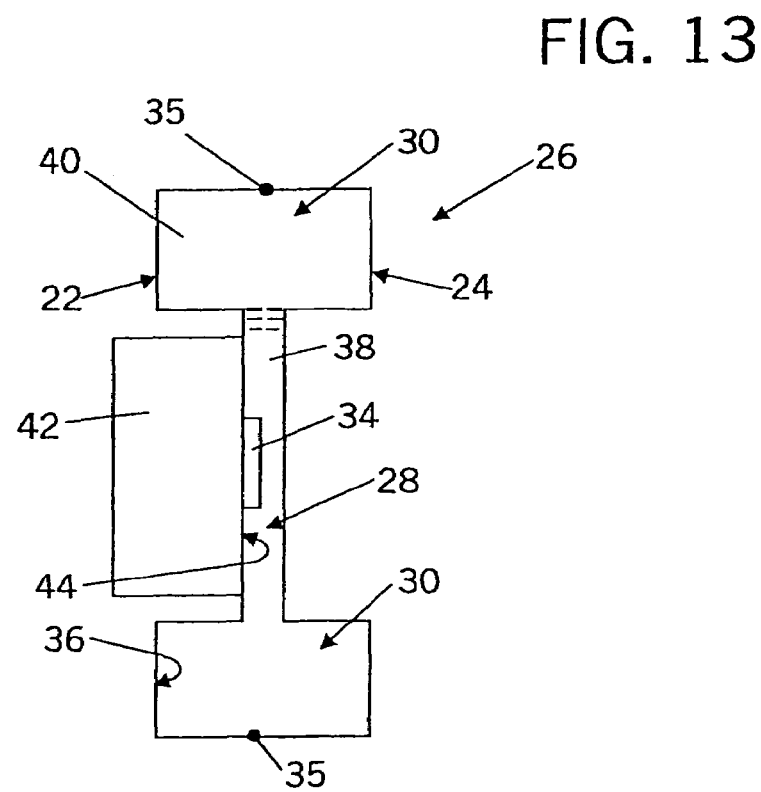
FIG. 13 is a schematic section view of condenser and evaporator portions of the thermosyphon of FIG. 12 taken along line 13-13, with the thermosyphon oriented vertically and mounted to an electronic circuit component

FIGS. 12 and 13 show a square system 26 that is vertically oriented and rotated to where $\theta$ is 45 degrees. At relatively larger angles $\theta$, depending on the application and the possibility of other orientations, such as other angles $\theta$ or horizontal orientations for example, the volume of coolant 38 can become excessive, and inhibit performance of the system 26 because of an inadequate void volume 40. The appropiate volume of coolant 38 can be determined by one of ordinary skill in the art based on use of the above equations, the application, and possible orientations of the system 26.

Figure 14:
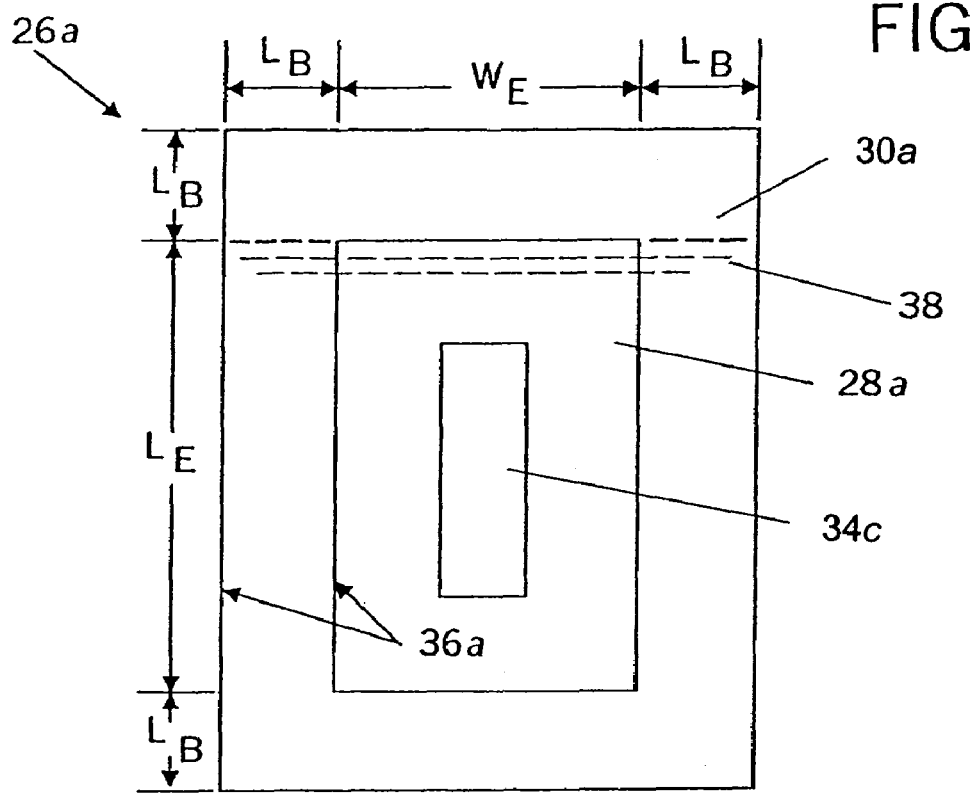
FIGS. 14 and 15 are section views of condenser and evaporator portions of other embodiments of vertically oriented thermosyphons according to the present invention.
Figure 15:
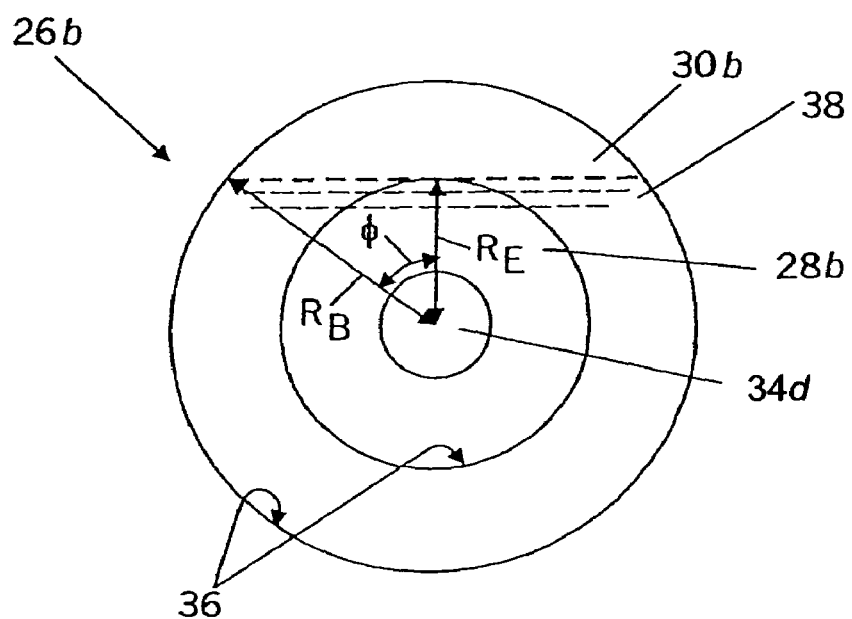

Any other planar shape, in addition to square, may be used for the evaporator 28 and pool belt 30 limits, and the respective shapes may differ within one embodiment. FIGS. 14 and 15, respectively, show rectangular and circular planar-shaped embodiments of phase-change heat transfer systems 26a, 26b. Schematic cross-sections for the rectangular and circular embodiments shown in FIGS. 14 and 15 look similar to those shown in FIGS. 3 and 8. Likewise, different shapes may be used for the boiling enhancement structure 34.

The rectangular phase-change heat transfer system 26a shown in FIG. 14 should conform to the following equation to have a substantially full evaporator in all orientations:

$$H_B/H_E = (2L_B+L_E+W_E)/L_E$$

It should be understood that the thermosyphon 20 of the present invention can function both with the evaporator 28 being less than full or with the system 26 holding liquid coolant 38 in excess of the preferred amount. To be sure that the system 26, 26a functions to nearly full capability at all orientations, however, it is desirable to conform to the design criteria described above. This design also results in the evaporator 28a being completely full in both horizontal orientations as well as vertical orientation, as shown in FIGS. 3, 6 and 8. The round system 26b shown in FIG. 15 having a coolant 38 depth of $(H_B+H_E)/2$ when in a horizontal orientation and dimensions that approximately satisfy the following equations provides a completely full evaporator in all orientations:

$$\phi = \frac{\pi}{2}\left(1-\left(\frac{R_E}{R_B}\right)^2\right)\left(1-\frac{H_E}{H_B}\right)+\frac{R_E}{R_B}\sqrt{1-\left(\frac{R_E}{R_B}\right)^2}$$

$$\phi = \cos^{-1}\left(\frac{R_E}{R_B}\right)$$

where $R_E$ is the radius of the evaporator, $R_B$ is the radius of the pool belt 30b, and $\phi$ is the angle formed between vertical and a pool belt radius line when the outer end of the pool belt radius line and the coolant 38 meet at the outer limit of the condenser 30b and the coolant 38 completely fills the vertically oriented evaporator 28b.

If the evaporator 28 is not full at a vertical orientation, at that vertical orientation there will not be coolant 38 in contact with the entire evaporator base plate 22, and the heat flux to the coolant 38 will be reduced. If at an orientation that is 180 degrees from that in FIG. 3, as illustrated in FIG. 8, the evaporator 28 is not full, the base plate 22 will not contact the coolant 38 at all. It is also desirable not to overfill the system 26. A liquid coolant 38 charge larger than required by the formulas described above guarantees filling of the evaporator in horizontal as well as vertical orientations. However, a designer must take into account the fact that the volume of two-phase mixture increases due to expansion when the device 20 is in operation. Hence, overfill of the system 26 would result in less space available for the vapors to condense and would increase pressure in the system 26, which could impact performance.

The saturation temperature of the coolant 38 depends on the system 26 pressure. Overfilling the system 26 would in effect, therefore, change the saturation temperature of the coolant 38 and in turn affect the system performance. The mass of the working fluid 38 at the time of charging the system 26 depends both on heat transfer performance considerations and the structural integrity of the thermosyphon 20. In addition to the heat transfer performance of the boiling enhancement device 34 in the evaporator 38 and that of the condenser 30 walls, the appropriate mass of working fluid 38 also depends on the heat transfer performance of the air-cooled surface or alternative heat sinks, the operating temperature of the heat source, and the allowable internal pressure in the thermosyphon 20. These parameters require evaluation for each application and design, and may be determined by one of ordinary skill in the art.

Figure 16:
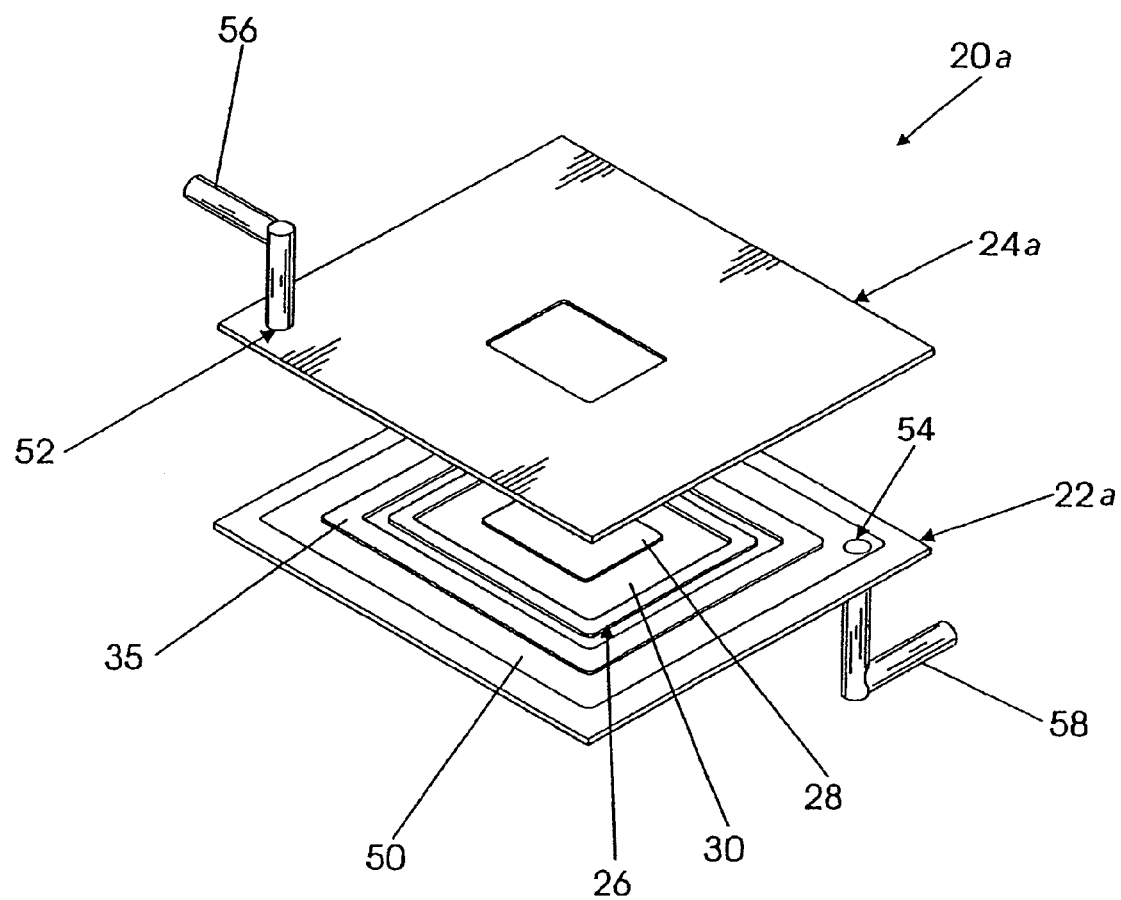
FIGS. 16, 17 and 18 are perspective views of other thermosyphons according to the present invention.

The cooling of the pool belt 30 in order to condense the vapor of the liquid coolant 38 can be performed in any one of a variety of ways that are know in the art. For example, the cooling fins 32 of FIG. 1 could be made hollow to communicate with the interior of the pool belt 30. This would increase the amount of surface area presented to the coolant 38 vapor within the pool belt 30, and in turn increase the heat transfer from the vapor to the pool belt. Another embodiment of the thermosyphon 20a according to the present invention is shown in FIG. 16. This embodiment includes a watercooled jacket 50. The cover plate 24a initially has two openings, not shown in the Figures, that respectively provide hydraulic connections to a vacuum pump line to evacuate the system 26 and to a supply line for filling the system with coolant 38. These openings are closed after the system 26 is charged with coolant 38 and evacuated. A permanent opening 52 in the cover plate 24a provides a hydraulic connection to a water supply line 56 that provides water to the cooling jacket 50. The base plate 22 has an opening 54 providing a hydraulic connection to a discharge line 58 that carries away the cooling water from the jacket 50. This thermosyphon 20a is referred to as an indirect, liquid-cooled thermosyphon because the working fluid 38 is not in direct contact with the heat source and the phase-change heat transfer system 26 is cooled with liquid.

Figure 17:
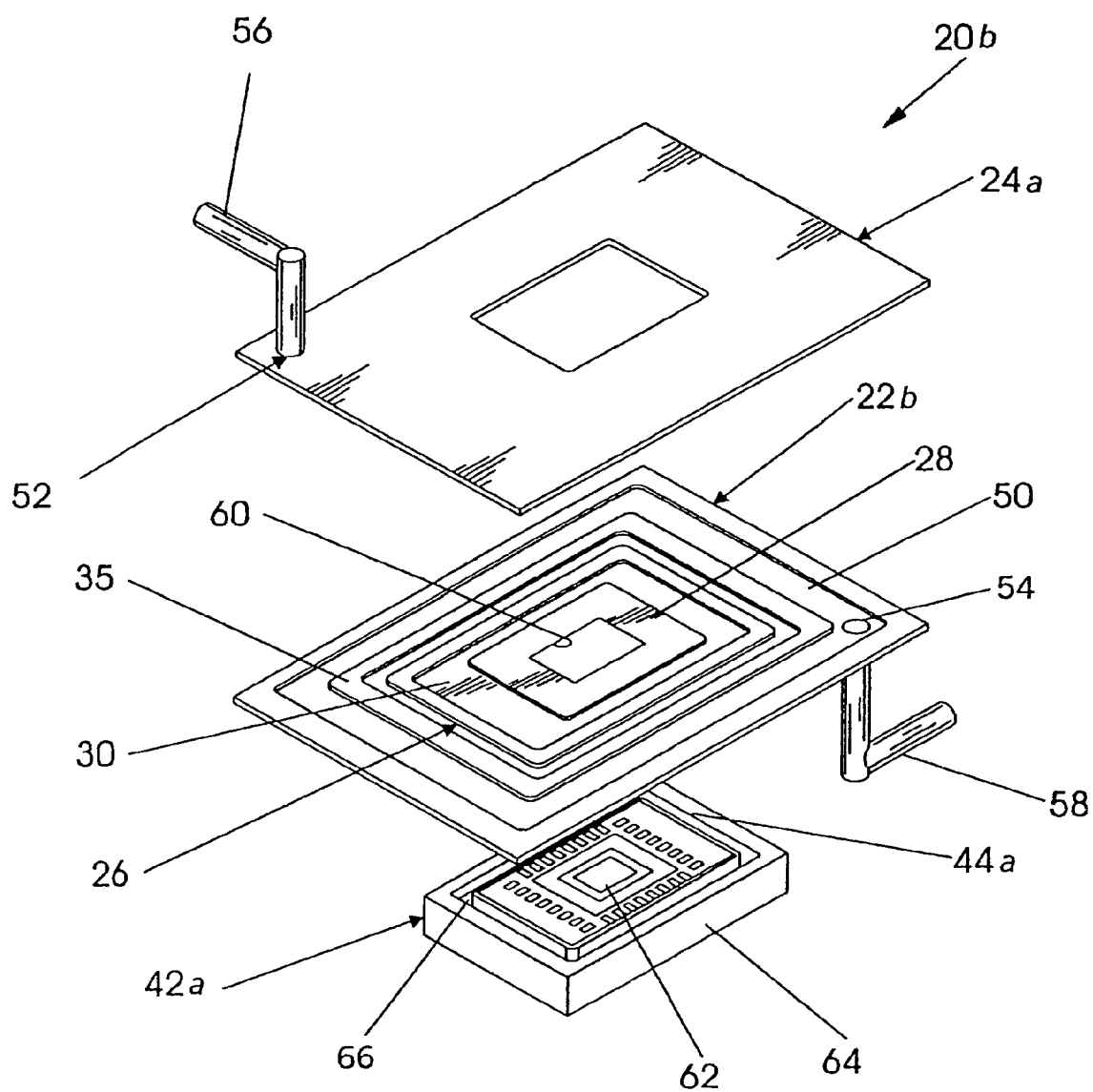

Another thermosyphon 20b according to the present invention and having a water-cooled jacket 50 is shown in FIG. 17. This embodiment 20b is shown with an opening 60 in the base plate 22b to accommodate a boiling enhancement structure 34 that is attached directly to a semiconductor chip package, shown as a Pin Grid Array (PGA) package 42a. The package 42a is one of many electronic components known to those of ordinary skill in the art that may be used with the present invention, and includes a semiconductor chip 62 and casing 64. The opening 60 brings the liquid in direct contact with the PGA package 42a, and is therefore referred to as a direct, liquid-cooled thermosyphon. A seal, such as an elastomeric or other type of seal placed in a groove 66 in the PGA package 42a, is provided between the mating surfaces of the PGA package 42a and the bottom plate 22b, as known to one of ordinary skill in the art.

Figure 18:
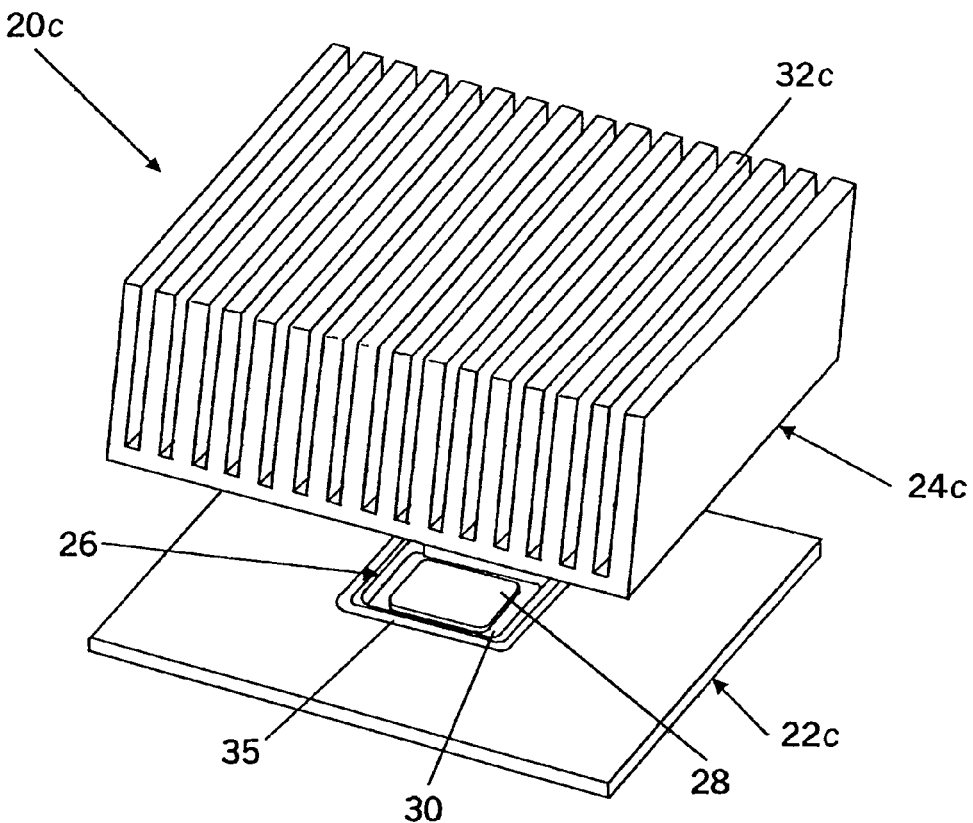

Another water-cooled thermosyphon 20c according to the present invention is shown in FIG. 18. The heat sink in this thermosyphon 20c comprises fins 32c that are integral to and extend from the free surface of the cover plate 24c. The cover plate 24c and fins 32c may be made from one piece of material, or from more than one piece of material and attached to each other by means known to one of ordinary skill in the art.

Figure 19:
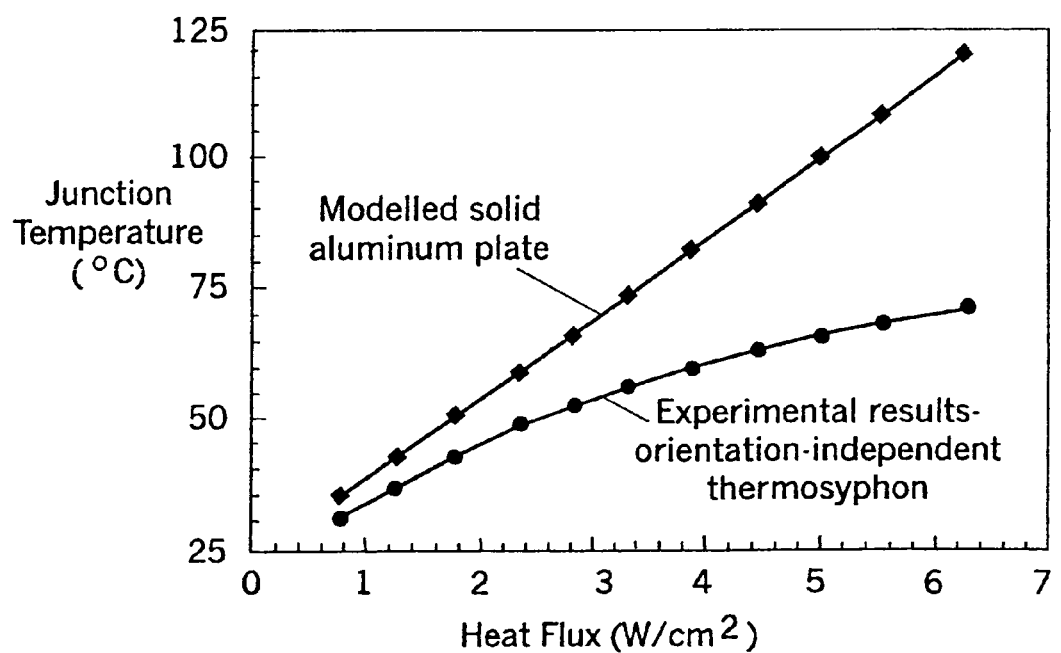
FIG. 19 is a graph of junction temperature as a function of heat flux for a modeled heat spreader and experimental results for a thermosyphon according to the present invention, similar to that shown in FIG. 1.

For experimental evaluation, a prototype of the thermosyphon according to the present invention similar to that shown in FIG. 1 was constructed from aluminum with fifty-two straight rectangular fins cut along the sides. The prototype comprised two plates of 2.25-mm thickness and had a square evaporator section of 30-mm length ($L_E$) in the middle. The thickness of the pool belt was 5 mm ($L_B$), making the outer limit of the pool belt 40 mm by 40 mm. The height of the pool belt ($H_B$) was 3.5 mm and the height of the evaporator ($H_E$) was 1.5 mm. The fins had a length of 16.5 mm and were cut out along the sides of each plate to help in heat rejection to ambient air. The two plates along with the peripheral fins resulted in an 89.5-mm by 89.5-mm by 4.5-mm thermosyphon. A 14-mm by 14-mm thermal test die package was used to simulate the chip heating conditions by controlling the temperature of the test package in contact with the thermosyphon. FIG. 19 compares the experimental performance of the thermosyphon with modeling results performed for a flat aluminum plate having modeled fins and the same outside dimensions as the prototype. A commercially available finite element software package was used for the model. The heat transfer and condenser boundary conditions of the thermosyphon experiment were replicated in the model. Natural convection correlations were used to specify the heat transfer coefficients on the upward facing surface of the modeled aluminum plate and along the fin surfaces at the plate edges. The heat source condition was simulated in the model by applying a uniform heat flux at the bottom along an area equal to the chip size. The remaining area along the bottom was modeled to be adiabatic.

A maximum heat flux of 6.3 W/cm$^2$ was achieved with the prototype thermosyphon under natural air-cooled conditions, with the junction temperature, which was taken as the average of the temperature measured by two thermistors embedded in the die, at 74.6° C. At the maximum heat flux, the junction temperature with the prototype thermosyphon was found to be 47.6° C. less than the junction temperature for an identical thickness modeled aluminum heat spreader. The junction temperature for the modeled aluminum spreader was taken to be the average temperature of the evaporator model. This is comparable to the performance of conventional, orientation-dependent thermosyphons that are commonly much thicker, and well exceeds the performance of conventional heat spreaders. When manufactured on the small scale required for cooling of individual semiconductor chips and other electronic packages, a microchannel boiling enhancement device improves performance both by facilitating boiling and by drawing the working fluid deep into the thin space of the evaporator.

The thermosyphon according to the present invention offers significant advantages over known heat pipe technology. This thermosyphon exploits gravity to maintain working fluid circulation. Although there is a certain limit to the heat removal capability even in gravity-assisted heat removal systems, such limits are usually higher than the capillary limit of heat pipes by about an order of magnitude. High heat removal capability is derived from ample supply of liquid to the evaporator. Although the present invention relies on gravity for working fluid circulation, the geometrical design of the enclosure results in orientation independence, unavailable in conventional thermosyphons.

Specific embodiments of the present invention are described above that provide enhanced cooling of electronic circuit components. One of ordinary skill in the heat transfer and electrical arts will quickly recognize that the invention has other applications in other environments. In fact, many embodiments and implementations are possible. For example, the shapes, sizes, and configurations of the thermosyphon heat spreader may be varied from those discussed without departing from the scope of the present invention. The following claims are in no way intended to limit the scope of the invention to the specific embodiments described.

What is claimed is:

1. A thermosyphon for enhancing cooling of electronic systems, the thermosyphon receiving heat from a heat-dissipating component and comprising:
    a central evaporator in contact with the heat-dissipating component, wherein the central evaporator comprises:
        a first plate having an interior major surface and an exterior major surface;
        a second plate, generally parallel to, spaced from, and similar in planar dimension to the first plate, having an interior major surface and an exterior major surface, the interior major surface opposing the interior major surface of the first plate, with a central parallel plane passing through the space therebetween, the second plate exterior major surface in contact with at least a portion of the component and extending outside the limits of that portion of the component, wherein the interior major surfaces define an evaporator volume;
    a condenser in fluid communication with and extending around the periphery of the evaporator, wherein the condenser comprises:
        a first wall extending from each evaporator plate, the first wall having an interior surface, a proximate edge and a distal edge, the proximate edge sealingly joined to the periphery of the respective plate, and the first wall extending perpendicularly from the entire periphery of each plate in a direction away from the central plane for a substantially constant distance, whereby the distal edge is substantially parallel to the plates;
        a second wall extending from each respective first wall, each second wall having an interior surface, a proximate edge and a distal edge, the proximate edge of each second wall sealingly joined to and extending perpendicularly from the entire distal edge of the adjoining first wall in a direction away from the evaporator volume; and
        a third wall extending from each respective second wall, each third wall having an interior surface, a proximate edge and a distal edge, the proximate edge of each third wall sealingly joined to and extending perpendicularly from the entire distal edge of the adjoining second wall such that the distal edges of the respective third walls abut and sealingly join at the central plane, whereby the interior surfaces of the first, second, and third walls define a condenser volume in fluid communication with the evaporator volume,
    a liquid coolant partially filling the condenser and substantially filling the evaporator; and
    means for cooling the condenser,
wherein at all orientations the evaporator is substantially full of liquid coolant,
wherein the planar shapes of the evaporator and condenser peripheries are substantially rectangular, and
wherein the cross-sectional shape of the condenser along an edge of the evaporator and perpendicular to the central plane is generally rectangular, the condenser is generally symmetric about the central plane, and the dimensions of the evaporator and condenser approximately satisfy the following relationship, where $H_B$ is the height of the condenser, $H_E$ is the distance between the interior surface of the second plate and the interior surface of the first plate, $L_B$ is the distance that the condenser extends from the periphery of the evaporator, perpendicular to the respective edge of the evaporator, $L_E$ is the length of the evaporator along one edge, and $W_E$ is the length of the evaporator along an edge perpendicular to the edge having length $L_E$:

$$H_B/H_E = (2L_B + L_E + W_E)/L_E.$$

2. The thermosyphon as recited in claim 1, wherein when the central plane is horizontal, within the condenser limits the surface of the liquid coolant is approximately a distance of $(H_B+H_E)/2$ from the interior surface of the plate that is beneath the coolant.

3. A thermosyphon for enhancing cooling of electronic systems, the thermosyphon receiving heat from a heat-dissipating component and comprising:
    a central evaporator in contact with the heat-dissipating component, wherein the central evaporator comprises:
        a first plate having an interior major surface and an exterior major surface;
        a second plate, generally parallel to, spaced from, and similar in planar dimension to the first plate, having an interior major surface and an exterior major surface, the interior major surface opposing the interior major surface of the first plate, with a central parallel plane passing through the space therebetween, the second plate exterior major surface in contact with at least a portion of the component and extending outside the limits of that portion of the component, wherein the interior major surfaces define an evaporator volume;
    a condenser in fluid communication with and extending around the periphery of the evaporator, wherein the condenser comprises:
        a first wall extending from each evaporator plate, the first wall having an interior surface, a proximate edge and a distal edge, the proximate edge sealingly joined to the periphery of the respective plate, and the first wall extending perpendicularly from the entire periphery of each plate in a direction away from the central plane for a substantially constant distance, whereby the distal edge is substantially parallel to the plates;
        a second wall extending from each respective first wall, each second wall having an interior surface, a proximate edge and a distal edge, the proximate edge of each second wall sealingly joined to and extending perpendicularly from the entire distal edge of the adjoining first wall in a direction away from the evaporator volume; and a third wall extending from each respective second wall, each third wall having an interior surface, a proximate edge and a distal edge, the proximate edge of each third wall sealingly joined to and extending perpendicularly from the entire distal edge of the adjoining second wall such that the distal edges of the respective third walls abut and sealingly join at the central plane, whereby the interior surfaces of the first, second, and third walls define a condenser volume in fluid communication with the evaporator volume, a liquid coolant partially filling the condenser and substantially filling the evaporator; and means for cooling the condenser, wherein at all orientations the evaporator is substantially full of liquid coolant, wherein the planar shapes of the evaporator and condenser peripheries are substantially square, and wherein the cross-sectional shape of the condenser along an edge of the evaporator and perpendicular to the central plane is generally rectangular, the condenser is generally symmetric about the central plane, and the dimensions of the evaporator and condenser approximately satisfy the following relationship, where $H_B$ is the height of the condenser, $H_E$ is the distance between the interior surface of the second plate and the interior surface of the first plate, $L_B$ is the distance that the condenser extends from the periphery of the evaporator, perpendicular to the respective edge of the evaporator, and $L_E$ is the length of the evaporator along each edge:

$$H_B/H_E = 2(1 + L_B/L_E).$$

4. The thermosyphon as recited in claim 3, wherein when the central plane is horizontal, within the condenser limits the surface of the liquid coolant is approximately a distance of $(H_B + H_E)/2$ from the interior surface of the plate that is beneath the coolant.

5. A thermosyphon for enhancing cooling of electronic systems, the thermosyphon receiving heat from a heat-dissipating component and comprising:

a central evaporator in contact with the heat-dissipating component, wherein the central evaporator comprises:

a first plate having an interior major surface and an exterior major surface;

a second plate, generally parallel to, spaced from, and similar in planar dimension to the first plate, having an interior major surface and an exterior major surface, the interior major surface opposing the interior major surface of the first plate, with a central parallel plane passing through the space therebetween, the second plate exterior major surface in contact with at least a portion of the component and extending outside the limits of that portion of the component, wherein the interior major surfaces define an evaporator volume;

a condenser in fluid communication with and extending around the periphery of the evaporator, wherein the condenser comprises:

a first wall extending from each evaporator plate, the first wall having an interior surface, a proximate edge and a distal edge, the proximate edge sealingly joined to the periphery of the respective plate, and the first wall extending perpendicularly from the entire periphery of each plate in a direction away from the central plane for a substantially constant distance, whereby the distal edge is substantially parallel to the plates;

a second wall extending from each respective first wall, each second wall having an interior surface, a proximate edge and a distal edge, the proximate edge of each second wall sealingly joined to and extending perpendicularly from the entire distal edge of the adjoining first wall in a direction away from the evaporator volume; and a third wall extending from each respective second wall, each third wall having an interior surface, a proximate edge and a distal edge, the proximate edge of each third wall sealingly joined to and extending perpendicularly from the entire distal edge of the adjoining second wall such that the distal edges of the respective third walls abut and sealingly join at the central plane, whereby the interior surfaces of the first, second, and third walls define a condenser volume in fluid communication with the evaporator volume, a liquid coolant partially filling the condenser and substantially filling the evaporator; and means for cooling the condenser, wherein at all orientations the evaporator is full of liquid coolant, wherein the planar shapes of the evaporator and condenser peripheries are substantially circular, and wherein the cross-sectional shape of the condenser along the condenser radius and perpendicular to the central plane is generally rectangular, the condenser is generally symmetric about the central plane, and the dimensions of the evaporator and condenser approximately satisfy the following relationships, where $H_B$ is the height of the condenser, $H_E$ is the distance between the interior surface of the second plate and the interior surface of the first plate, $R_B$ is the radius of the condenser as measured from the center of the evaporator to the outer limit of the condenser, and $R_E$ is the radius of the evaporator, and when the central plane is vertical, $\phi$ is the angle away from vertical of a line formed by the condenser radius when the outer endpoint of the condenser radius intersects the surface of the liquid coolant that fills the evaporator:

$$\phi = \frac{\pi}{2}\left(1 - \left(\frac{R_E}{R_B}\right)^2\right)\left(1 - \frac{H_E}{H_B}\right) + \frac{R_E}{R_B}\sqrt{1 - \left(\frac{R_E}{R_B}\right)^2}$$

$$\phi = \cos^{-1}\left(\frac{R_E}{R_B}\right).$$

6. The thermosyphon as recited in claim 5, wherein when the central plane is horizontal, on the surface of the liquid coolant is approximately a distance of $(H_B + H_E)/2$ from the interior surface of the plate that is beneath the coolant.

7. A thermosyphon for enhancing cooling of electronic systems, the thermosyphon receiving heat from a heat-dissipating component and comprising:

a central evaporator in contact with the heat-dissipating component, wherein the central evaporator comprises:

a first plate having an interior major surface and an exterior major surface;

a second plate, generally parallel to, spaced from, and similar in planar dimension to the first plate, having an interior major surface and an exterior major surface, the interior major surface opposing the interior major surface of the first plate, with a central parallel plane passing through the space therebetween, the second plate exterior major surface in contact with at least a portion of the component and extending outside the limits of that portion of the component, wherein the interior major surfaces define an evaporator volume;

a condenser in fluid communication with and extending around the periphery of the evaporator, wherein the condenser comprises:

a first wall extending from each evaporator plate, the first wall having an interior surface, a proximate edge and a distal edge, the proximate edge sealingly joined to the periphery of the respective plate, and the first wall extending perpendicularly from the entire periphery of each plate in a direction away from the central plane for a substantially constant distance, whereby the distal edge is substantially parallel to the plates;

a second wall extending from each respective first wall, each second wall having an interior surface, a proximate edge and a distal edge, the proximate edge of each second wall sealingly joined to and extending perpendicularly from the entire distal edge of the adjoining first wall in a direction away from the evaporator volume; and a third wall extending from each respective second wall, each third wall having an interior surface, a proximate edge and a distal edge, the proximate edge of each third wall sealingly joined to and extending perpendicularly from the entire distal edge of the adjoining second wall such that the distal edges of the respective third walls abut and sealingly join at the central plane, whereby the interior surfaces of the first, second, and third walls define a condenser volume in fluid communication with the evaporator volume, a liquid coolant partially filling the condenser and substantially filling the evaporator; and means for cooling the condenser, wherein at all orientations the evaporator is full of liquid coolant, wherein the planar shapes of the evaporator and condenser peripheries are substantially square, and wherein the thermosyphon approximately satisfies the following relationships, where $H_B$ is the height of the condenser, $H_E$ is the distance between the interior surface of the second plate and the interior surface of the first plate, $L_B$ is the distance that the condenser extends from the periphery of the evaporator, perpendicular to the respective edge of the evaporator, $L_E$ is the length of the evaporator along each edge, $\theta$ is an angle between two parallel edges of the condenser planar limits and horizontal when the central plane is vertically oriented and surface of the coolant is at the uppermost point of the evaporator, $\theta^*$ is an angle between two parallel edges of the condenser planar limits and horizontal when the central plane is vertically oriented and surface of the coolant is at the uppermost point of the evaporator and at the second highest corner of the condenser:

$$\theta^* = \tan^{-1}\left(\frac{L_B}{L_B + L_E}\right);$$

for $0 \leq \theta \leq \theta^*$:

$$\frac{H_B}{H_E} = \frac{2\left(1 + \frac{L_B}{L_E}\right)\frac{L_B}{L_E}}{\frac{L_B}{L_E} + \left(\frac{1}{2} + \frac{L_B}{L_E}\right)\tan\theta}; \text{ and}$$

for $\theta^* \leq \theta \leq 45°$:

$$\frac{H_B}{H_E} = \frac{1 + \frac{L_B}{L_E}}{1 + \frac{1}{2}\left\{1 - \frac{1}{2}(\tan\theta + \cot\theta)\right\}\frac{L_B}{L_E}}.$$

8. The thermosyphon as recited in claim 7, wherein when the central plane is horizontal, within the condenser limits the surface of the liquid coolant is approximately a distance of $(H_B+H_E)/2$ from the interior surface of the plate that is beneath the coolant.

* * * * *